United States Patent
Barth et al.

(10) Patent No.: US 8,569,820 B2
(45) Date of Patent: Oct. 29, 2013

(54) CAPACITOR HAVING A PLURALITY OF PARALLEL CONDUCTIVE MEMBERS

(75) Inventors: Hans-Joachim Barth, Munich (DE);
Erwin Ruderer, MarktSchwaben (DE);
Alexander Von Glasow, Deisenhofen (DE); Philipp Riess, Munich (DE);
Erdem Kaltalioglu, Newburgh, NY (US); Peter Baumgartner, Munich (DE); Thomas Benetik, Munich (DE);
Helmut Horst Tews, Munich (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 13/344,714

(22) Filed: Jan. 6, 2012

(65) Prior Publication Data
US 2012/0099243 A1    Apr. 26, 2012

Related U.S. Application Data

(62) Division of application No. 11/947,591, filed on Nov. 29, 2007, now Pat. No. 8,138,539.

(51) Int. Cl.
*H01L 27/108* (2006.01)

(52) U.S. Cl.
USPC ........... 257/307; 257/306; 257/308; 257/773; 257/776; 257/E21.008; 257/E21.015

(58) Field of Classification Search
CPC ................ H01L 23/5223; H01L 27/0805
USPC ................ 257/306–308, 773, 776, E21.008, 257/E21.011, E21.015
See application file for complete search history.

(56) References Cited

U.S. PATENT DOCUMENTS

| | | | |
|---|---|---|---|
| 5,583,359 A | 12/1996 | Ng et al. | |
| 6,635,916 B2 | 10/2003 | Aton | |
| 6,690,570 B2 | 2/2004 | Hajimiri et al. | |
| 6,747,307 B1 | 6/2004 | Vathulya et al. | |
| 6,822,312 B2 | 11/2004 | Sowlati et al. | |
| 7,190,014 B2 | 3/2007 | Kao | |
| 7,209,340 B2 | 4/2007 | Iioka et al. | |
| 7,385,241 B2 | 6/2008 | Choi | |
| 7,598,592 B2 | 10/2009 | Chen et al. | |
| 7,768,055 B2 | 8/2010 | Chinthakindi et al. | |
| 8,138,539 B2 * | 3/2012 | Barth et al. | 257/307 |
| 2006/0202343 A1 | 9/2006 | Huang et al. | |
| 2008/0061343 A1 | 3/2008 | Lan et al. | |

* cited by examiner

*Primary Examiner* — Kenneth Parker
*Assistant Examiner* — Jose R Diaz
(74) *Attorney, Agent, or Firm* — Slater & Matsil, L.L.P.

(57) ABSTRACT

Semiconductor devices and methods of manufacture thereof are disclosed. In one embodiment, a capacitor plate includes a plurality of first parallel conductive members, and a plurality of second parallel conductive members disposed over the plurality of first parallel conductive members. A first base member is coupled to an end of the plurality of first parallel conductive members, and a second base member is coupled to an end of the plurality of second parallel conductive members. A connecting member is disposed between the plurality of first parallel conductive members and the plurality of second parallel conductive members, wherein the connecting member includes at least one elongated via.

27 Claims, 10 Drawing Sheets

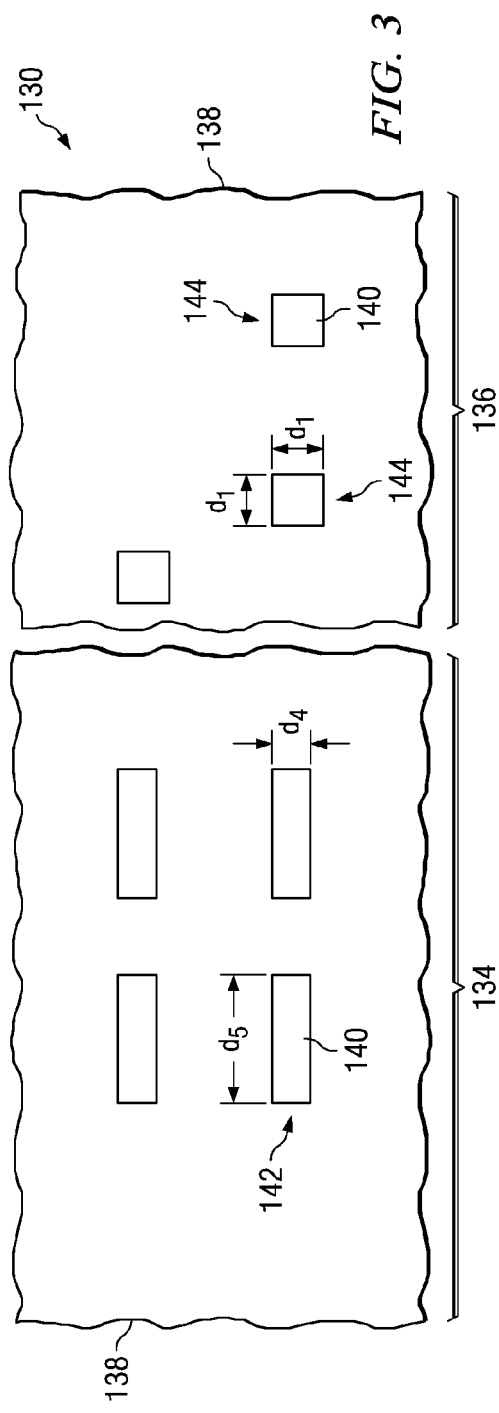
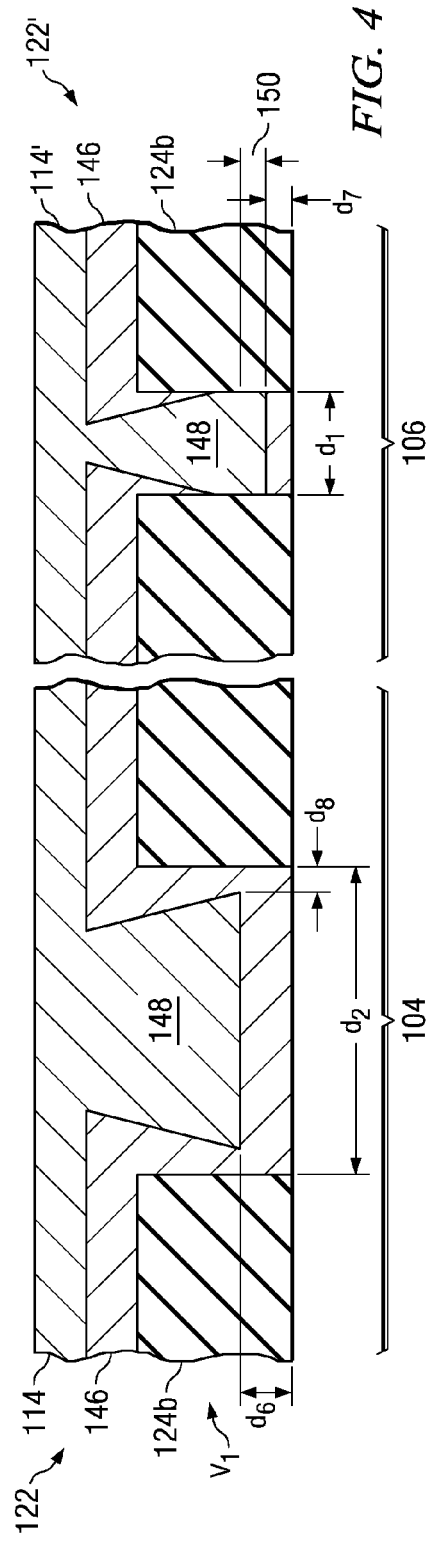

CAPACITOR HAVING A PLURALITY OF PARALLEL CONDUCTIVE MEMBERS

This is a divisional application of U.S. application Ser. No. 11/947,591, entitled "Semiconductor Devices and Methods of Manufacture Thereof," which was filed on Nov. 29, 2007, and is hereby incorporated herein by reference.

TECHNICAL FIELD

The present invention relates generally to the fabrication of semiconductor devices, and more particularly to the fabrication of capacitors in integrated circuits.

BACKGROUND

Semiconductor devices are used in a variety of electronic applications, such as personal computers, cell phones, digital cameras, and other electronic equipment, as examples. Semiconductor devices are typically fabricated by sequentially depositing insulating or dielectric layers, conductive layers, and semiconductive layers of material over a semiconductor substrate, and patterning the various layers using lithography to form circuit components and elements thereon.

Capacitors are elements that are used in semiconductor devices for storing an electrical charge. Capacitors essentially comprise two conductive plates separated by an insulating material. When an electric current is applied to a capacitor, electric charges of equal magnitude yet opposite polarity build up on the capacitor plates. The capacitance, or the amount of charge held by the capacitor per applied voltage, depends on a number of parameters, such as the area of the plates, the distance between the plates, and the dielectric constant value of the insulating material between the plates, as examples. Capacitors are used in applications such as electronic filters, analog-to-digital converters, memory devices, control applications, and many other types of semiconductor device applications.

What are needed in the art are improved methods of fabricating capacitors in semiconductor devices and structures thereof.

SUMMARY OF THE INVENTION

Technical advantages are generally achieved by embodiments of the present invention, which provide novel methods of manufacturing capacitor plates, capacitors, semiconductor devices, and structures thereof.

In accordance with one embodiment of the present invention, a capacitor plate includes a plurality of first parallel conductive members, and a plurality of second parallel conductive members disposed over the plurality of first parallel conductive members. A first base member is coupled to an end of the plurality of first parallel conductive members. A second base member is coupled to an end of the plurality of second parallel conductive members. A connecting member is disposed between the plurality of first parallel conductive members and the plurality of second parallel conductive members, wherein the connecting member comprises at least one elongated via.

The foregoing has outlined rather broadly the features and technical advantages of embodiments of the present invention in order that the detailed description of the invention that follows may be better understood. Additional features and advantages of embodiments of the invention will be described hereinafter, which form the subject of the claims of the invention. It should be appreciated by those skilled in the art that the conception and specific embodiments disclosed may be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawings, in which:

FIG. 3 illustrates a top view of a lithography mask for the conductive material layer comprising the plurality of elongated vias shown in FIG. 1;

FIG. 4 shows a more detailed cross-sectional view of a conductive material layer comprising the plurality of elongated vias shown in FIG. 1;

Corresponding numerals and symbols in the different figures generally refer to corresponding parts unless otherwise indicated. The figures are drawn to clearly illustrate the relevant aspects of the embodiments and are not necessarily drawn to scale.

DETAILED DESCRIPTION OF ILLUSTRATIVE EMBODIMENTS

Figure 1:
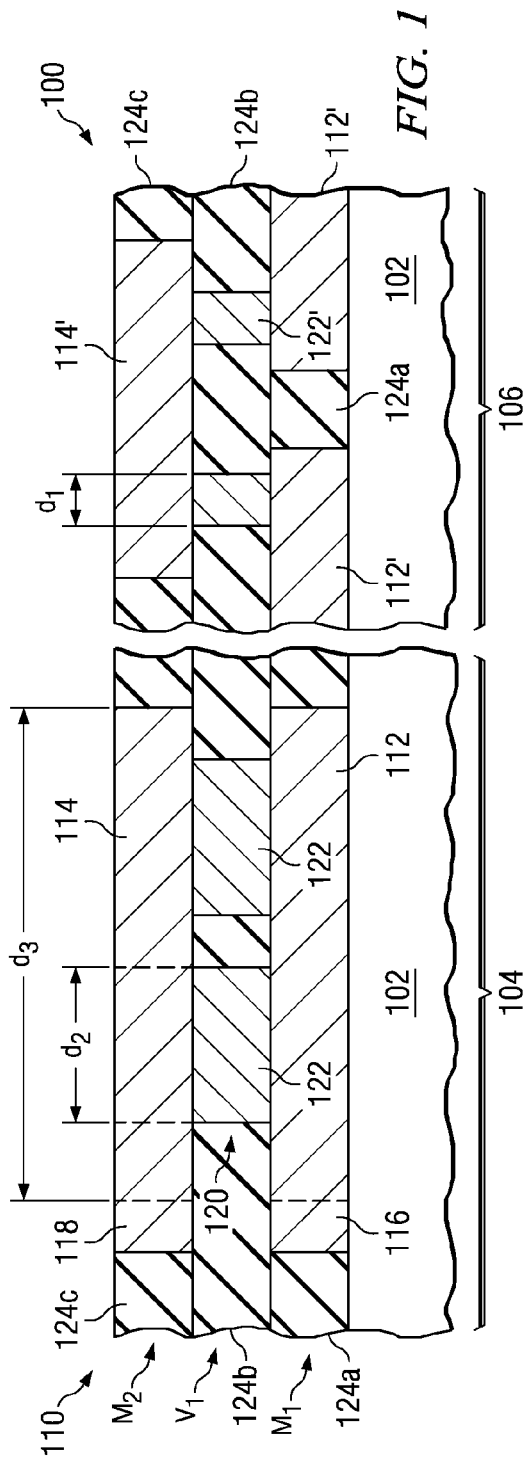
FIG. 1 shows a cross-sectional view of a semiconductor device in accordance with an embodiment of the present invention, wherein a capacitor plate includes a connecting member comprising a plurality of elongated vias disposed between first and second parallel conductive members of the capacitor plate.

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The present invention will be described with respect to preferred embodiments in specific contexts, namely implemented in CMOS device applications. Embodiments of the invention may also be implemented in other semiconductor applications such as memory devices, logic devices, analog devices, power devices, radio frequency (RF) devices, digital devices, and other applications that utilize capacitors, for example.

Some properties of capacitors are a function of size. A larger amount of energy or charge may be stored by a capacitor the larger the capacitor plates are, for example. In some semiconductor device applications, it is desirable to increase the capacitance of capacitors, but area on the integrated circuit is often limited. Thus, what are needed in the art are improved methods of manufacturing capacitors and structures thereof that more efficiently use the area of the integrated circuit.

One type of capacitor used in semiconductor devices is referred to as a metal-insulator-metal (MIM) capacitor, which has capacitor plates formed parallel to a horizontal surface of a wafer, and a dielectric material formed between the capacitor plates. Another type of capacitor used in semiconductors is a vertical parallel plate (VPP) capacitor, wherein conductive lines are formed in stacks and are connected together by vias. The stacked conductive lines and vias function as a vertical capacitor plate and are separated by an adjacent vertical capacitor plate by a dielectric material to form a capacitor.

Some vertical parallel plate capacitors suffer from reduced reliability due to misalignment in the lithography processes used to form the vias between the stacked conductive lines, which results in high electrical fields proximate the conductive lines. The high electrical fields may cause early dielectric breakdown, e.g., in reliability tests. In some metallization schemes that utilize copper as a material for the conductive lines and vias, which has a high mobility and tends to diffuse into some dielectric materials, liners are used to prevent copper diffusion. However, vias of conventional vertical parallel plate capacitors comprise a minimum feature size for the semiconductor device, and due to the small size of the vias, liners formed within the vias may be thin or incompletely formed, resulting in leakage current between the vias of the vertical capacitor plates, which further degrades the reliability of the capacitors.

These and other problems are generally solved or circumvented, and technical advantages are generally achieved, by embodiments of the present invention, which comprise novel vertical parallel plate capacitor structures that are formed in multiple conductive layers of semiconductor devices. The capacitor plates of the capacitors comprise connecting members that include at least one elongated via, which improves reliability of the capacitors and increases capacitance density.

FIG. 1 shows a cross-sectional view of a semiconductor device 100 in accordance with an embodiment of the present invention, wherein a capacitor plate 110 includes a connecting member 120 comprising a plurality of elongated vias 122 disposed between adjacent first parallel conductive members 112 and second parallel conductive members 114 of the capacitor plate 110. The capacitor plate 110 comprises a plurality of first parallel conductive members 112 and a plurality of second parallel conductive members 114, as shown in a top view in FIG. 2. Each of the plurality of second parallel conductive members 114 is disposed over an underlying first parallel conductive member 112. At least some of the plurality of first parallel conductive members 112 are coupled together by a first base member 116, and at least some of the plurality of second parallel conductive members 114 are coupled together by a second base member 118. One or more of the plurality of first parallel conductive members 112 and second parallel conductive members 114 may be formed that are not connected to the base members 116 and 118, respectively, in accordance with an embodiment of the invention, to be described further herein.

Figure 5:
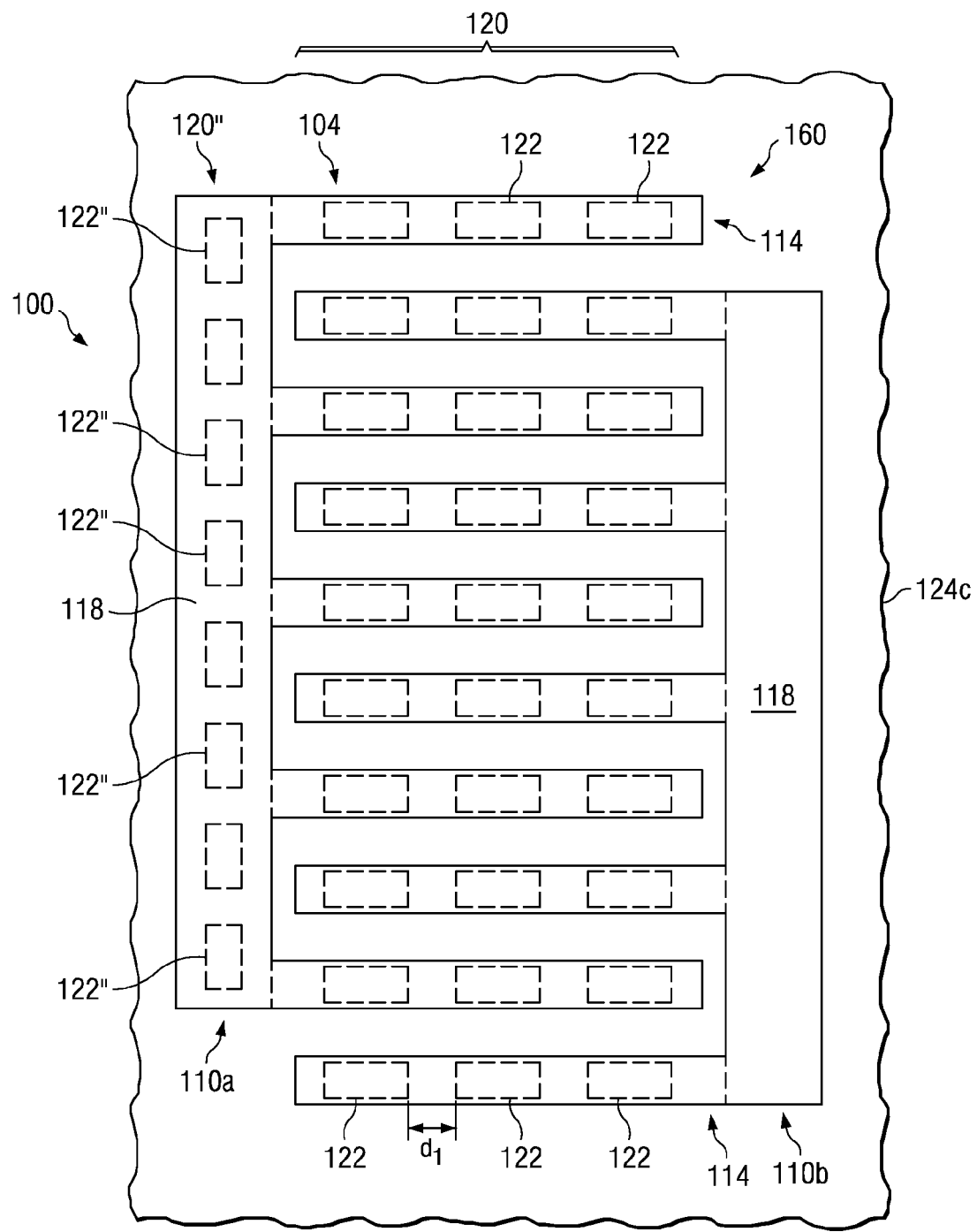
FIG. 5 is a top view of a capacitor comprising two capacitor plates that each have connecting members comprising a plurality of elongated vias disposed between first and second parallel conductive members in accordance with an embodiment of the present invention.

The first parallel conductive member 112, the first base member 116, the connecting member 120, the second parallel conductive member 114, and the second base member 118 form a capacitor plate 110 of a capacitor in accordance with embodiments of the present invention. Two capacitor plates 110a and 110b may be formed proximate one another within insulating materials 124a, 124b, and 124c, forming a capacitor 160 in accordance with embodiments of the present invention, as shown in FIG. 5 in a top view. Portions of the insulating materials 124a, 124b, and 124c disposed between the plates 110a and 110b function as a capacitor dielectric.

The capacitor plate 110 is formed over a workpiece 102 within a plurality of conductive material layers $M_1$, $V_1$, and $M_2$, as shown in FIG. 1. The workpiece 102 may include a semiconductor substrate comprising silicon or other semiconductor materials covered by an insulating layer, for example. The workpiece 102 may also include other active components or circuits, not shown. The workpiece 102 may comprise silicon oxide over single-crystal silicon, for example. The workpiece 102 may include other conductive layers or other semiconductor elements, e.g., transistors, diodes, etc., not shown. Compound semiconductors, GaAs, InP, Si/Ge, or SiC, as examples, may be used in place of silicon. The workpiece 102 may comprise a silicon-on-insulator (SOI) substrate, for example.

The workpiece 102 comprises a first region 104 and a second region 106, as shown. The first region 104 is also referred to herein as a capacitor region, and the second region 106 is also referred to herein as a conductive line region, for example. A vertical parallel plate capacitor is formed in the first region 104, and a plurality of conductive lines and vias that may be used for interconnecting other elements of the semiconductor device 100 are formed in the second region 106, to be described further herein.

A first conductive material layer $M_1$ is formed over the workpiece 102. The first conductive material layer $M_1$ may comprise a metallization layer for conductive lines 112' in the conductive line region 106 of the semiconductor device 100, for example. To form the first conductive material layer $M_1$, a damascene process may be used. A first insulating material 124a is formed over the workpiece 102. The first insulating material 124a may comprise about 1,000 to 4,000 Angstroms, or about 5,000 Angstroms or less, of an oxide such as $SiO_2$, a nitride such as $Si_3N_4$, a low-k dielectric material having a dielectric constant less than about 3.9, a capping layer, a liner, an etch stop layer, or combinations and multiple layers thereof, as examples. Alternatively, the first insulating material 124a may comprise other dimensions and materials, for example. The first insulating material 124a may be formed using chemical vapor deposition (CVD), atomic layer deposition (ALD), metal organic chemical vapor deposition (MOCVD), physical vapor deposition (PVD), a spin-on process, or jet vapor deposition (JVD), as examples, although alternatively, other methods may also be used.

The first insulating material 124a is patterned with a pattern for a plurality of first parallel conductive members 112 in the first region 104 and a pattern for conductive lines 112' in the second region 106. A pattern for a first base member 116 is also formed in the first insulating material 124a in the first region 104. The patterned first insulating material 124a is filled with a conductive material to fill the patterns, and excess conductive material is removed from the top surface of the first insulating material 124a, using an etch process and/or a chemical-mechanical polish (CMP) process, for example, leaving the plurality of first parallel conductive members 112, the first base member 116, and the conductive lines 112' formed within the first insulating material 124a. The conductive material may comprise one or more conductive liners and a fill material formed over the liner, for example. The liner(s) may comprise Ta, TaN, WN, WCN, Ru, Ti, TiN, TiSiN, other materials, or combinations thereof, and the fill material may comprise Al, Cu, W, Ag, other metals, a semiconductive material, or combinations thereof, as examples.

Alternatively, the first conductive material layer $M_1$ may be formed using a subtractive etch process. For example, a conductive material 112/112' may be formed over the workpiece 102, and the conductive material 112/112' may be subtractively etched to form the plurality of first parallel conductive members 112 and first base member 116 in the first region 104 and the conductive lines 112' in the second region 106. The first insulating material 124a is then deposited between the plurality of first parallel conductive members 112, the first base member 116, and the conductive lines 112'.

The first base member 116 is coupled to one end of each of the first parallel conductive members 112. The first base member 116 electrically couples together the plurality of first parallel conductive members 112, forming a comb or fork-shaped conductive feature 112/116 that is a portion of a capacitor plate 110, in accordance with embodiments of the present invention.

Next, a second conductive material layer $V_1$ is formed over the first conductive material layer $M_1$. The second conductive material layer $V_1$ comprises a via layer or a via level in a multi-layer interconnect of the semiconductor device 100. A single or dual damascene process (e.g., in which second parallel conductive members 114 are also formed) may be used to form the second conductive material layer $V_1$, for example. Alternatively, a subtractive etch process may be used.

For example, in a single damascene process, a second insulating material 124b is formed over the first conductive material layer $M_1$. The second insulating material 124b may comprise similar materials and dimensions and may be formed using similar methods as described for the first insulating material 124a, for example. The second insulating material 124b is patterned with a pattern for a connecting member 120 over each of the plurality of first parallel conductive members 112 in the first region 104. The connecting members 120 comprise at least one elongated via 122. A pattern for a plurality of vias 122' is also formed in the second region 106 using the same lithography mask and process for the connecting members 120. The patterned second insulating material 124b is filled with a conductive material to fill the patterns, and excess conductive material is removed from the top surface of the second insulating material 124b using a CMP and/or etch process. A conductive liner may be formed over the patterned second insulating material 124b before filling the patterns for the connecting members 120 and the vias 122', to be described further herein. The conductive material may comprise the same materials as described for the first conductive material layer $M_1$, for example.

Figure 2:
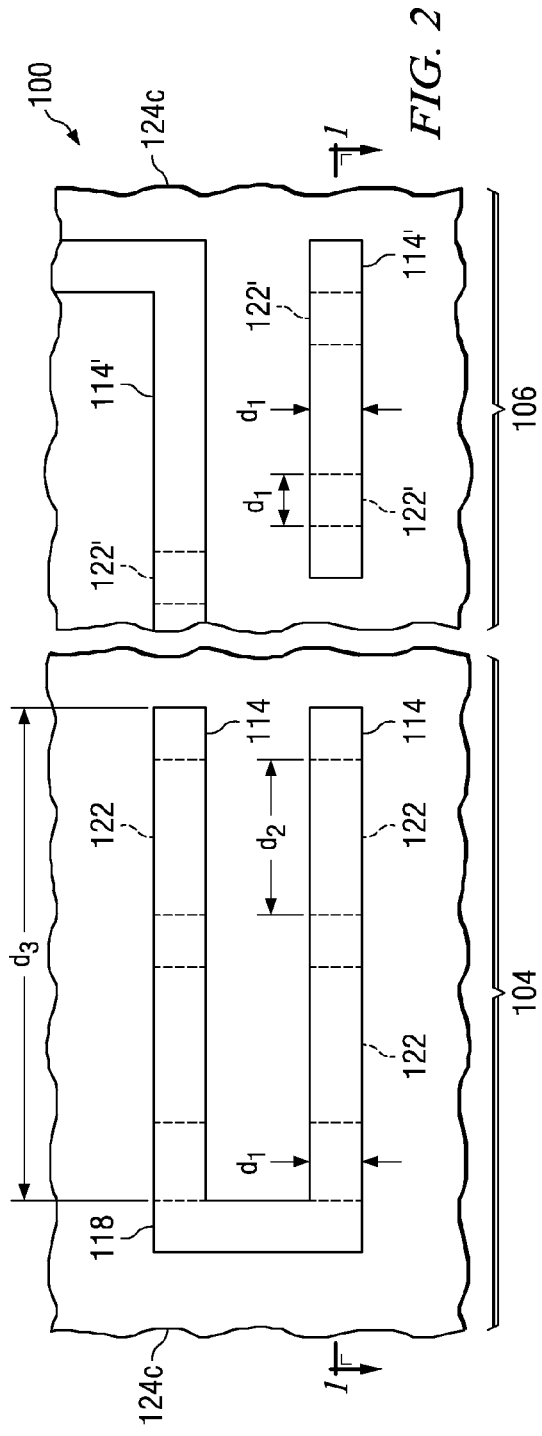
FIG. 2 is a top view of the semiconductor device shown in FIG. 1.

In the embodiment shown in FIGS. 1 and 2, the connecting members 120 comprise a plurality of elongated vias 122. The elongated vias 122 comprise a width comprising dimension $d_1$ and a length comprising dimension $d_2$, wherein dimension $d_2$ is greater than dimension $d_1$. The connecting members may comprise a width $d_1$ comprising the same dimension as vias 122' formed in the second region 106, for example. Vias 122' formed in the second region 106 comprise a width and length comprising dimension $d_1$. Dimension $d_1$ may comprise a minimum feature size of the semiconductor device 100, for example. Dimension $d_1$ may comprise about 50 to 70 nm, for example, although alternatively, dimension $d_1$ may comprise other dimensions.

Dimension $d_2$ is about twice dimension $d_1$ in some embodiments, although alternatively, dimension $d_2$ may be greater than twice dimension $d_1$, for example. The elongated vias 122 may be spaced apart by dimension $d_1$, in some embodiments. The vias 122' may be circular in shape due to the lithography and etch processes, and the elongated vias 122 may be oval, even though patterns in the lithography mask (such as the mask 130 shown in FIG. 3) used to pattern the vias 122' and elongated vias 122 may be square and rectangular, respectively, not shown in the drawings. Furthermore, the vias 122' and elongated vias 122 may be tapered inwardly, e.g., from a top surface of the semiconductor device 100, having a larger dimension near the top of the second insulating material 124b than at the bottom due to the etch process, also not shown (see FIG. 10).

A third conductive material layer $M_2$ is formed over the second conductive material layer $V_1$. The third conductive material layer $M_2$ may comprise a metallization layer for conductive lines 114' in the conductive line region 106 of the semiconductor device 100, for example. To form the third conductive material layer $M_2$, a damascene process may be used. A third insulating material 124c is formed over the second insulating material 124b. The third insulating material 124c may comprise similar materials and dimensions as described for the first insulating material 124a, for example. The third insulating material 124c is patterned with a pattern for a plurality of second parallel conductive members 114 in the first region 104 and a pattern for conductive lines 114' in the second region 106. A pattern for a second base member 118 is also formed in the third insulating material 124c. The patterned third insulating material 124c is filled with a conductive material to fill the patterns, and excess conductive material is removed from the top surface of the third insulating material 124c, using a CMP and/or etch process. Alternatively, the third conductive material layer $M_2$ may be formed using a subtractive etch process.

The second conductive material layer $V_1$ and the third conductive material layer $M_2$ may also be formed using a dual damascene process, wherein a single insulating material layer 124b/124c is formed over the first insulating material 124a. A first lithography mask is used to pattern the elongated vias 122 and vias 122', and a second lithography mask is used to pattern the second parallel conductive members 114 and base members 118. The patterns in the insulating material 124b/124c are then filled simultaneously with a conductive material.

The second base member 118 is coupled to one end of each of the second parallel conductive members 114, as shown in a top view in FIG. 2. The second base member 118 electrically couples together the plurality of second parallel conductive members 114, forming a comb or fork-shaped conductive feature 114/118 that comprises a portion of a capacitor plate 110. The fork-shaped conductive feature 114/118 may comprise substantially the same dimensions as the fork-shaped conductive feature 112/116 formed in the first conductive material layer $M_1$. The fork-shaped feature 114/118 is disposed over the fork-shaped feature 112/116 formed in the first conductive material layer $M_1$.

The elongated vias 122 of the connecting members 120 are shown in phantom in the top view shown in FIG. 2. The first and second parallel conductive members 112 and 114 comprise a width comprising dimension $d_1$ and a length comprising $d_3$. A top view of the conductive lines 114' is shown in the second region 106, with the vias 122' comprising dimension $d_1$ shown in phantom, disposed beneath the conductive lines 114'. Only two second parallel conductive members 114 are shown in FIG. 2; alternatively, the capacitor plate 110 may include a plurality of first and second parallel conductive members 114, e.g., three or more, depending on the capacitance desired.

The metallization or conductive material layers $M_1$, $V_1$, and/or $M_2$ may comprise conductive material layers disposed at various locations of the semiconductor device 100. For example, layer $M_1$ may comprise a first metallization layer, e.g., the first layer formed in a back-end-of the line (BEOL) process. Or, layer $M_1$ may comprise a second or greater metallization layer, disposed above and over previously formed metallization layers, not shown. Alternatively, layers $M_1$, $V_1$, and/or $M_2$ may comprise conductive material layers formed in a front-end-of the line (FEOL) process, for example.

Thus, in accordance with an embodiment of the present invention, a capacitor plate 110 includes a plurality of first parallel conductive members 112 and a plurality of second parallel conductive members 114 disposed over the plurality of first parallel conductive members 112. A first base member 116 is coupled to an end of the plurality of first parallel conductive members 112, the first base member 116 electrically coupling the plurality of first parallel conductive members 112 together. A second base member 118 is coupled to an end of the plurality of second parallel conductive members 114, the second base member 118 electrically coupling the plurality of second parallel conductive members 114 together. A connecting member 120 is disposed between the plurality of first parallel conductive members 112 and the plurality of second parallel conductive members 114, wherein the connecting member 120 comprises at least one elongated via 122.

Only one capacitor plate 110 is shown in FIGS. 1 and 2. The first parallel conductive member 112, the first base member 116, the connecting member 120, the second parallel conductive member 114, and the second base member 118 form a capacitor plate 110 of a capacitor in accordance with embodiments of the present invention. Two capacitor plates 110a and 110b may be formed proximate one another within the insulating materials 124a, 124b, and 124c, forming a capacitor 160, in accordance with embodiments of the present invention, as shown in FIG. 5 in a top view. Portions of the insulating materials 124a, 124b, and 124c function as a capacitor dielectric in these embodiments.

In accordance with embodiments of the present invention, two capacitor plates 110 are placed adjacent one another, wherein the first and second parallel conductive members 112 and 114 are staggered and interleaved or interwoven between each plate 110, as shown in FIG. 5 in a top view, to be described further herein. The novel connecting members 120 comprise elongated vias that are disposed between and coupled to adjacent first and second parallel conductive members 112 and 114. Additional metallization layers and conductive material layers may be used above the second parallel conductive members 114 or below the first parallel conductive members 112, and multiple stacked layers of connecting members 120 comprising elongated vias 122 may be used to connect to additional parallel conductive members 112 or 114.

In semiconductor device manufacturing, via levels of multi-layer interconnect systems are generally optimized for processing a single size of via. It is difficult to process small features, particularly in dense arrays, and lithography and etch processes for vias can be challenging. For example, all vias within a via level for conventional semiconductor devices typically comprise the same size, so that the etch process, lithography, and exposure processes may be optimized. However, in accordance with embodiments of the present invention, elongated vias 122 are used in the capacitor region 104 of a semiconductor device 100. Optical proximity correction (OPC) of the lithography mask used to pattern the semiconductor device 100 may be modified in accordance with embodiments of the present invention to achieve the desired size of the elongated vias 122, for example, because large features print at a different size and etch at different etch rates than small features.

FIG. 3 shows a top view of a lithography mask 130 for the conductive material layer $V_1$ comprising the plurality of elongated vias 122 in the first region 104 and vias 122' in the second region 106 shown in FIG. 1. Region 134 of the mask 130 corresponds with and is used to pattern the first region 104 of FIGS. 1 and 2, and region 136 of the mask 130 corresponds with and is used to pattern the second region 106 of FIGS. 1 and 2.

The lithography mask 130 comprises an opaque material 138 and a plurality of apertures 140 comprising patterns within the opaque material 138. The lithography mask 130 is used in a lithography process (e.g., by exposure to light or energy) to pattern a layer of photosensitive material formed over the workpiece 102, the layer of photosensitive material is developed, and the layer of photosensitive material is used as a mask to pattern a material layers, such as the second insulating layer 124b of the via layer $V_1$ in a damascene process.

Patterns 142 for the elongated vias 122 in the first region 134 comprise a width or dimension $d_4$ corresponding to dimension $d_1$ of FIG. 2, and a length or dimension $d_5$ corresponding to dimension $d_3$ of FIG. 2. The patterns 144 for the vias 122' in region 136 comprise a dimension $d_1$ that corresponds to dimension $d_1$ of vias 122' of FIG. 2. Because larger features print larger during lithography and are etched more quickly in some etch processes that smaller features are etched, the patterns 142 for the elongated vias 122 in region 134 may be made smaller on the lithography mask 130 to accommodate for the different print sizes and etch rates in the lithography and etch process. The patterns 144 of the lithography mask 130 comprise a greater width, e.g., dimension $d_1$ in a vertical direction, and smaller length, e.g., dimension $d_1$ in a horizontal direction in the conductive line region 136 than in the capacitor region 134, e.g., compared to the width $d_4$ and length $d_5$ of the patterns 142 in the capacitor region 134. For example, on the lithography mask 130, the width of elongated vias of the patterns 142 or dimension $d_4$ may be made smaller by about 5 to 20% than dimension $d_1$ of the minimum square vias of pattern 144. Alternatively, the size of the patterns 142 may be altered by other amounts to compensate for the desired size difference of the elongated vias 122 compared to the vias 122'. Note that the dimensions of the mask 130 may not be the same as dimensions on the semiconductor device 100 due to a reduction factor of the lithography system used, which may have a reduction factor of about 2:1 or 4:1, as examples.

The mask 130 shown in FIG. 3 having adjusted dimensions $d_4$ and $d_5$ for the elongated via patterns 142 may be used to pattern the semiconductor device 100 shown in FIGS. 1 and 2, and also FIG. 5. Similar adjustments to patterns 142 for elongated vias may also be made to lithography masks for the other embodiments to be described herein, for example.

FIG. 4 shows a more detailed cross-sectional view of a conductive material layer $V_1$ comprising the plurality of elongated vias 122 shown in FIG. 1. A sputter process may be used to form a liner 146 comprising a conductive material, although other deposition processes may also be used. Smaller vias 122' formed in the second region 106 may have regions 150 located proximate the bottom surface along the sidewalls where the liner 146 does not form or is very thin. A thin or missing liner may not be problematic in the conductive line or second region 106 in some applications, but thin or missing liners 146 are likely to cause leakage current if small vias 122' are used in the capacitor region 104, for example. Advantageously, because the vias 122 in the capacitor or first region 104 are elongated and comprise a length or dimension $d_2$ that is larger than dimension $d_1$, the liner 146 is thicker on the bottom surface, e.g., having dimension $d_6$ comprising about 5 to 50 nm, whereas the liner 146 is thinner on the bottom surface of the vias 122' in the second region 106, as shown at dimension $d_7$. Also, the liner 146 advantageously is formed over the entire sidewall of the larger elongated vias 122 in the first region 104, because the openings for the elongated vias 122 are wider at the top, resulting in improved, continuous, liner coverage during the deposition process. The liner 146 of the elongated vias 122 may have a dimension $d_8$ along a lower portion of the sidewall of about 1 to 20 nm, for example. Alternatively, the liner 146 may comprise other dimensions.

A conductive fill material 148 is then formed over the liner 146, also shown in FIG. 4. If the conductive fill material 148 comprises copper, then the liner may comprise Ta, TaN, WN, WCN or Ru, as examples. If the conductive fill material 148 comprises aluminum, the liner may comprise Ti, TiN, or TiSiN, as examples. Alternatively, the liner 146 and fill material 148 may comprise other materials. The fill material 148 may comprise a semiconductive material such as polysilicon or amorphous silicon, and a liner may not be included, for example.

Advantageously, because the vias 122 of the connecting member 120 of the capacitor plate 110 are elongated, the liner 146 is fully formed over the sidewalls and bottom surface of the patterns for the elongated vias 122, resulting in decreased leakage current for capacitors formed from the capacitor plates 110, in accordance with embodiments of the present invention.

FIG. 5 shows a top view of a capacitor 160 formed in a capacitor region 104, wherein the capacitor 160 comprises two capacitor plates 110a and 110b that each have connecting members 120 comprising a plurality of elongated vias 122 (shown in phantom) disposed between first and second parallel conductive members 112 and 114 in accordance with an embodiment of the present invention. Only the second parallel conductive members 114 and base members 118 are visible in the top view shown in FIG. 5. A plurality of first parallel conductive members 112 and first base members 116 are disposed immediately beneath, (e.g., parallel and adjacent to or proximate) the plurality of second parallel conductive members 114 and the second base members 118.

The second parallel conductive members 114 of the first plate 110a are interwoven or interleaved with the second parallel conductive members 114 of the second plate 110a. Likewise, the first parallel conductive members 112 of the first plate 110a are interwoven or interleaved with the first parallel conductive members 112 of the second plate 110a.

The elongated vias 112 may be spaced apart by a distance or dimension $d_1$, which may comprise a minimum feature size of the semiconductor device 100, for example. The elongated vias 112 may be spaced apart by a distance $d_1$ comprising substantially the same as the width of the elongated vias 112, for example, in some embodiments.

The connecting members 120 comprise an array of rectangular elongated vias 122 in this embodiment. The elongated vias 122 coupled between the second parallel conductive members 114 and the first parallel conductive members 112 of the first plate 110a are parallel to adjacent elongated vias 122 coupled between the second parallel conductive members 114 and the first parallel conductive members 112 of the second plate 110b. The insulating material 124a, 124b, and 124c between the first plate 110a and the second plate 110b comprises the capacitor dielectric of the capacitor 160. The interleaved comb structure of the interwoven first and second parallel conductive members 112 and 114 and the elongated vias 122 of the first and second plates 110a and 110b results in a high level of capacitance. The adjacent parallel elongated vias 122 advantageously increase the capacitance density per area of the novel capacitor 160.

The first parallel conductive members 112 and the second parallel conductive members 114 of the first capacitor plate 110a are interwoven with the first parallel conductive members 112 and the second parallel conductive members 114 of the second capacitor plate 110b. The first parallel conductive members 112 and the second parallel conductive members 114 of the first capacitor plate 110a comprise alternating fingers of conductive material. For example, one first parallel conductive member 112 of the first capacitor plate 110a is disposed between two of the first parallel conductive members 112 of the second capacitor plate 110b within the same conductive material layer $M_1$.

In accordance with an embodiment of the present invention, the first and second parallel conductive members 112 and 114 of the capacitor plates 110a and 110b comprise members having widths that substantially comprise a minimum feature size of the semiconductor device 100. The first and second parallel conductive members 112 and 114 of the first capacitor plate 110a may also be spaced apart from the first and second parallel conductive members 112 and 114 of the second plate 110b by a dimension $d_1$ that is substantially equal to the minimum feature size of the semiconductor device 100, for example.

The first and second parallel conductive members 112 and 114 of the capacitor plates 110a and 110b comprise the same length in accordance with some embodiments of the present invention. For example, the first and second parallel conductive members 112 and 114 of the first capacitor plate 110a may comprise a first length, and the first and second parallel conductive members 112 and 114 of the second capacitor plate 110b may comprise a second length, the second length being substantially the same as the first length. The first and second lengths may comprise about ten times or greater than the minimum feature size of the semiconductor device 100, as an example, although alternatively, the first and second lengths may comprise other dimensions.

The first and second parallel conductive members 112 and 114 of the first and second plates 110a and 110b are staggered, to leave space for the insulating materials 124a, 124b, and 124c between the plates 110a and 110b that form the capacitor dielectric. The dimensions of the first and second parallel conductive members 112 and 114 and the elongated vias 122, the space between them, and the type of dielectric material (e.g., of insulating materials 124a, 124b, and 124c) may be selected to achieve a desired capacitance, for example.

The capacitor plates 110a and 110b may be coupled to conductive lines (e.g., such as conductive lines 112' and 114' in the second region 106 shown in FIGS. 1 and 2) to make electrical connection to other devices on the semiconductor device 100, or to make connection with a contact or terminal of the semiconductor device 100. The capacitor plates 110a and 110b may be symmetric, as shown in FIG. 5. The shapes of the capacitor plates 110a and 110b may comprise mirror images, as an example.

In other words, the semiconductor device 100 shown in FIG. 5 includes a workpiece 102 and plurality of first parallel conductive members 112 (see FIG. 1) disposed over the workpiece 102, the plurality of first parallel conductive members 112 having a first end and a second end opposite the first end. Alternating first parallel conductive members 112 are slightly staggered, e.g., in the horizontal direction in a view such as the one shown in FIG. 5, to couple together alternating first parallel conductive members 112 by a base member 116. A connecting member 120 comprising at least one elongated via 122 is disposed over and coupled at least to each of the plurality of first parallel conductive members 112. A plurality of second parallel conductive members 114 is disposed over and coupled to the connecting members 120, the plurality of second parallel conductive members 114 having a first end and a second end, the second end being opposite the first end. Alternating second parallel conductive members 114 are also slightly staggered in the horizontal direction, to couple together alternating first parallel conductive members 114 by a base member. A first base member 116, e.g., of the first capacitor plate 110a, is coupled to the first end of every other of the plurality of first parallel conductive members 112, the first base member 116 of the first capacitor plate 110a electrically coupling alternating plurality of first parallel conductive members 112 together. In the first conductive material layer $M_1$, a second base member 116, e.g., of the second capacitor plate 110b, is coupled to the second end of the plurality of first parallel conductive members 112 not connected to the first base member 118, the second base member 116 of the second capacitor plate 110b electrically coupling alternating plurality of first parallel conductive members 112 together. Similarly, in the third conductive material layer $M_2$, a third base member 118, e.g., of the first capacitor plate 110a, is coupled to the first end of every other of the plurality of second parallel conductive members 114, the third base member 118 of the first capacitor plate 110a electrically coupling alternating plurality of second parallel conductive members 114 together. A fourth base member 118, e.g., of the second capacitor plate 110b, is coupled to the second end of the plurality of second parallel conductive members 114 not connected to the third base member 118 of the first capacitor plate 110a, the fourth base member 118 of the second capacitor plate 110b electrically coupling alternating plurality of second parallel conductive members 114 together.

Note that in the preceding paragraph, the first base members 116 are referred to as a first base member 116 of the first capacitor plate 110a and a second base member 116 of the second capacitor plate 110b. Similarly, the second base members 118 are referred to as a third base member 118 of the first capacitor plate 110a and a fourth base member 118 of the second capacitor plate. In other portions of the detailed description, the base members of both capacitor plates 110a and 110b are referred to as first base members 116 and second base members 118, for example.

Note that in accordance with embodiments of the present invention, the base members 116 and 118 may be coupled together using an optional additional connecting member 120" that may comprise at least one via 122" that may be elongated or may comprise other dimensions, as shown in phantom in FIG. 5, to be described further herein.

Figure 6:
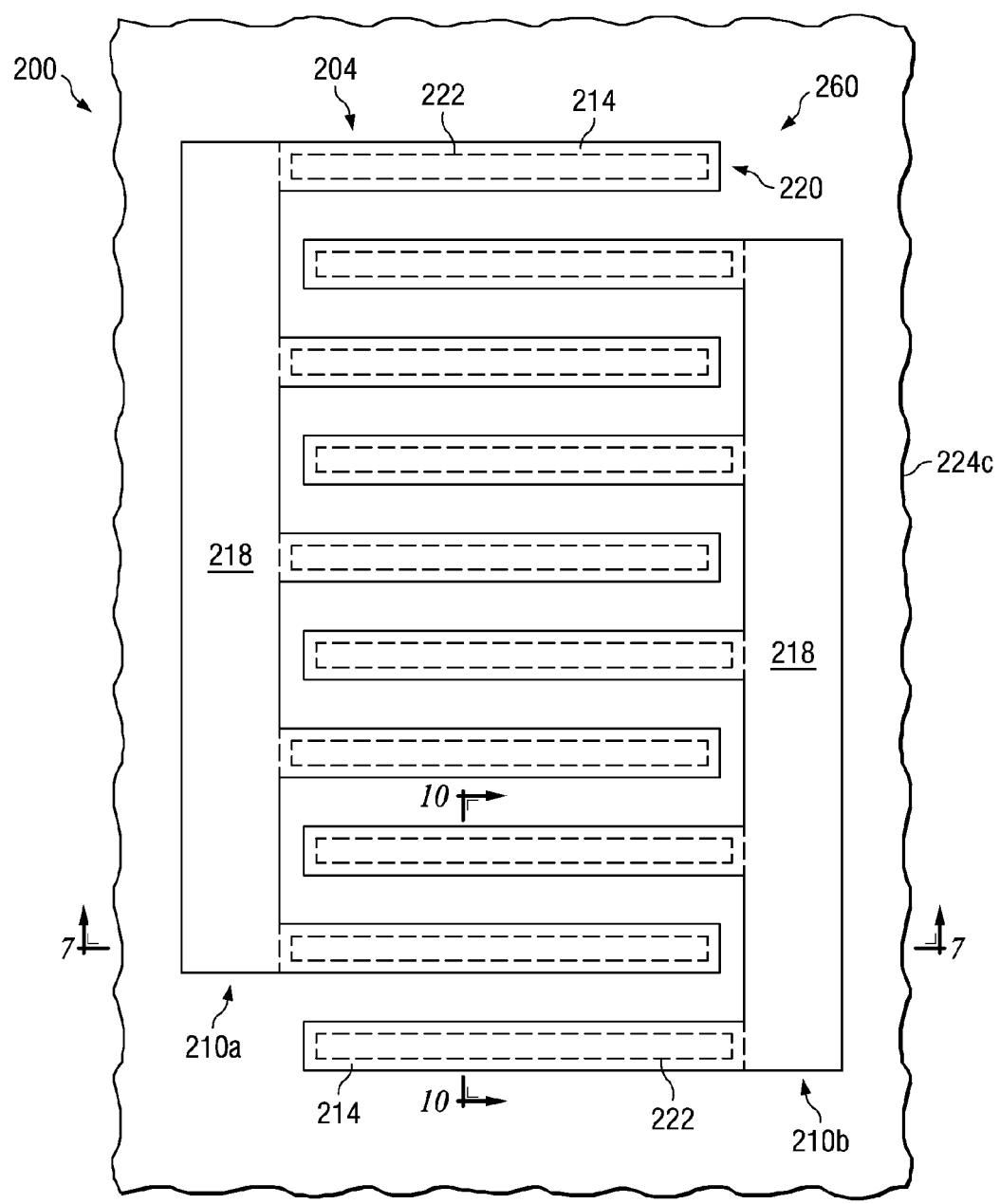
FIG. 6 shows a top view of a capacitor comprising two capacitor plates that have connecting members comprising a single elongated via disposed between first and second parallel conductive members in accordance with another embodiment of the present invention.
Figure 7:
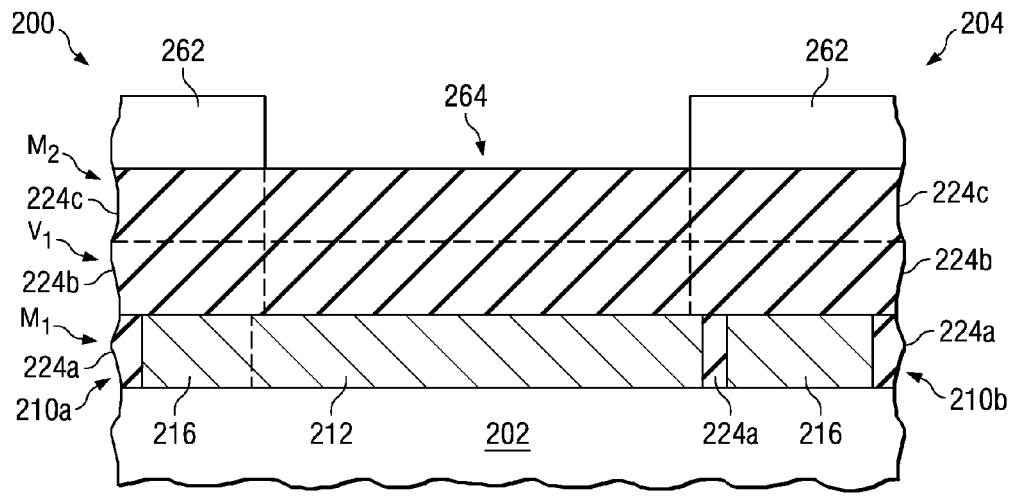
FIGS. 7, 8, and 9 illustrate cross-sectional views of the capacitor shown in FIG. 6 at various stages of manufacturing.
Figure 8:
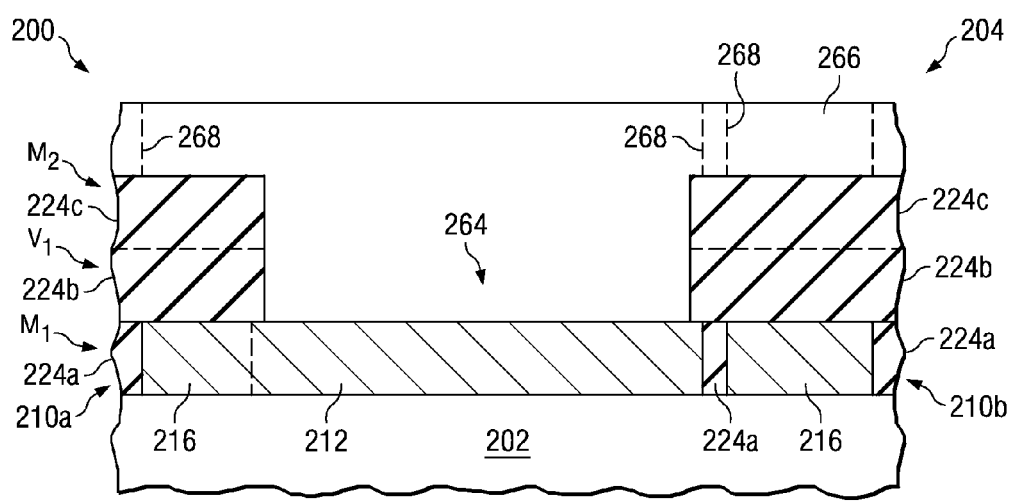
Figure 9:
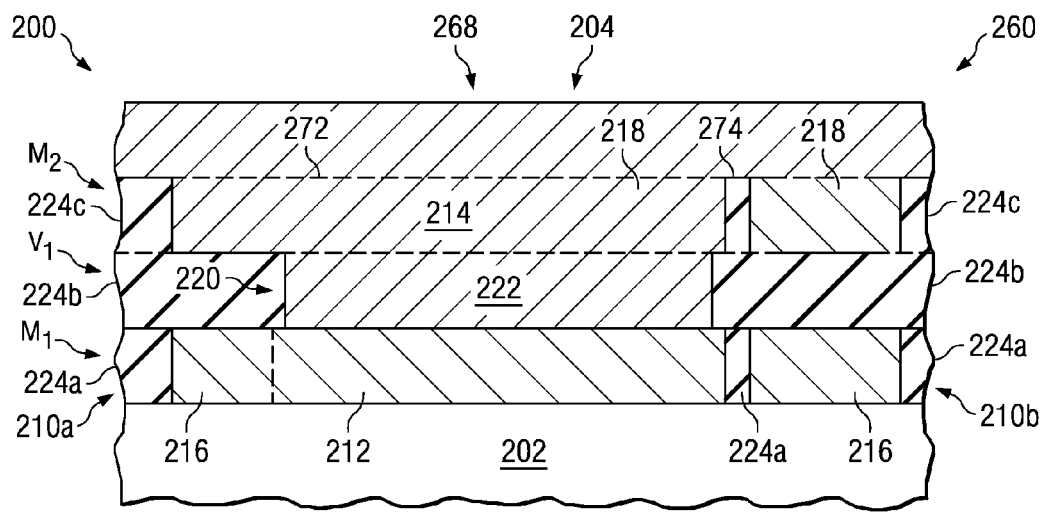
Figure 10:
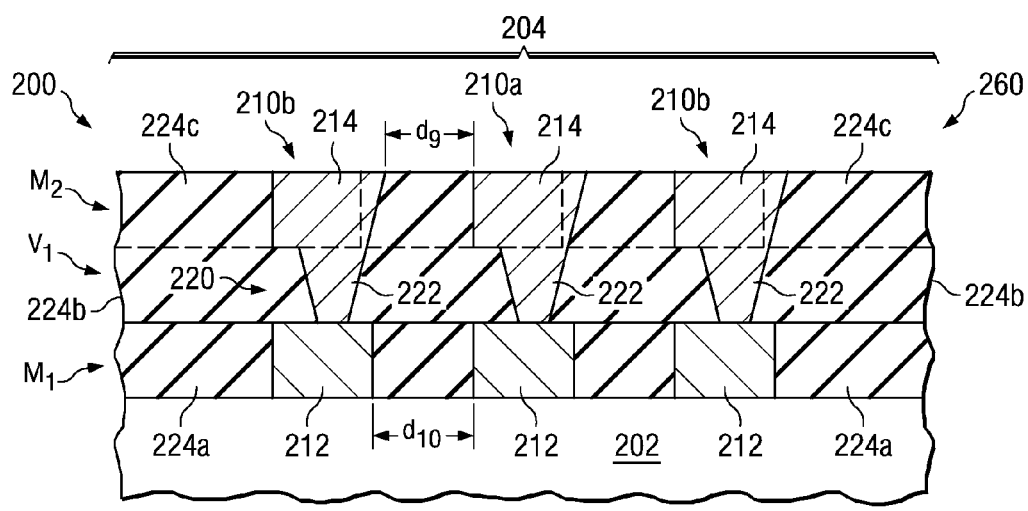
FIG. 10 is a cross-sectional view of the capacitor shown in FIG. 6 in a direction perpendicular to the view shown in FIGS. 7 through 9.

In accordance with another embodiment of the present invention, the connecting members 220 may each comprise a single elongated via 222, as shown in FIG. 6. A top view of a capacitor 260 is shown, wherein the capacitor 260 comprises two capacitor plates 210a and 210b that include connecting members 220 comprising single elongated vias 222 disposed between the second parallel conductive members 214 and the first parallel conductive members 212 (not shown in FIG. 6; see FIG. 9). FIGS. 7, 8, and 9 show cross-sectional views of the capacitor 160 shown in FIG. 6 at various stages of manufacturing. FIG. 10 shows a cross-sectional view of the capacitor 160 shown in FIG. 6 in a direction perpendicular to the view shown in FIGS. 7 through 9. Like numerals are used for the various elements in FIGS. 7 through 10 that were used to describe FIGS. 1 through 5. To avoid repetition, each reference number shown in FIGS. 6 through 10 is not described again in detail herein. Rather, similar materials and dimensions x02, x04, x06, etc. . . . are preferably used for the various material layers shown as were described for FIGS. 1 through 5, where x=1 in FIGS. 1 through 5 and x=2 in FIGS. 6 through 10.

To manufacture the semiconductor device 200, a workpiece 202 is provided, and first parallel conductive members 212 and first base members 216 of the first and second capacitor plates 210a and 210b are formed within a first insulating material 224a of a conductive material layer $M_1$, using a single damascene process. A dual damascene process may be used to form the elongated vias 222 and the second parallel conductive members 214. A via-first process or a via-last dual damascene process may be used.

For example, in a via-first process, a second insulating material 224b may be formed over the first conductive material layer $M_1$, and a third insulating material 224c may be formed over the second insulating material 224b, as shown in FIG. 7. The second and third insulating materials 224b and 224c may comprise a single insulating material layer, for example. A first layer of photoresist 262 may be deposited over the third insulating material 224c, and the first layer of photoresist 262 may be patterned using a first lithography mask (not shown) and an exposure process with a pattern 264 for the elongated vias. The first layer of photoresist 262 is developed, and the first layer of photoresist 262 is used as a mask during an etch process, removing portions of the second and third insulating material 224b and 224c and forming the pattern 264 for the elongated vias 222 in the second and third insulating material 224b and 224c. The first layer of photoresist 262 is then removed.

A second layer of photoresist 266 is deposited over the patterned second and third insulating material 224b and 224c, as shown in FIG. 8. The second layer of photoresist 266 fills the patterns 264 in the second and third insulating material 224b and 224c, for example. The second layer of photoresist 266 is patterned using a second lithography mask (not shown) and an exposure process with a pattern 268 for the second parallel conductive members 214 and the second base members 218. The second layer of photoresist 266 is developed, and the second layer of photoresist 266 is used as a mask during an etch process, removing portions of the third insulating material 224c and forming the pattern 268 for the second parallel conductive members 214 and the second base members 218 in the third insulating material 224c. If the second and third insulating material 224b and 224c comprise a single insulating material layer, only the top portion of the single insulating layer, represented by the third insulating material 224c, is patterned with the pattern 268 for the second parallel conductive members 214 and the second base members 218. The second layer of photoresist 266 is then removed.

Referring next to FIG. 9, a conductive material is then deposited over the patterned second and third insulating material 224b and 224c, filling the patterns 264 and 268 and forming the elongated vias 222, second parallel conductive members 214, and the second base members 218 in a single fill process. A liner (not shown) may also be used, as shown in FIG. 4. Excess conductive material is removed from the top surface 274 of the third insulating material 224c using an etch process and/or CMP process, so that the top surface 272 of the second parallel conductive members 214 and the second base members 218 is substantially coplanar with the top surface 274 of the third insulating material 224c, for example, as shown in phantom in FIG. 9.

FIG. 10 shows a cross-sectional view of the capacitor 260 shown in FIG. 6 in a direction perpendicular to the view shown in FIGS. 7 through 9. The etch processes used to form the single elongated vias 222 and the second parallel conductive members 214 and the second base members 218 may result in inwardly-tapered sidewalls of the vias 222 and members 214, which can be seen in FIG. 10.

Due to misalignments between the lithography of via 222 and the lithography of the second parallel conductive members 214 the dimension $d_9$ proximate the top of the elongated vias 222 and the second parallel conductive members 214 may be substantially smaller than the dimension $d_{10}$ between the first parallel conductive members 212 of the first and second capacitor plates 210a and 210b. Dimension $d_{10}$ may comprise a minimum feature size of the semiconductor device 200, for example. The lower portion of the elongated vias 222 and the second parallel conductive members 214 may comprise a width that is about 20 nm or less than the width at the top portion of the elongated vias 222 and the second parallel conductive members 214, for example.

The connecting members 220 may each comprise a single elongated via 222 comprising at least a top portion having substantially the same size and shape as at least a top portion of the first and second parallel conductive members 212 and 214. The connecting members 220 may comprise at least a top portion comprising substantially the same length and width as a portion of the plurality of second parallel conductive members 214. For example, the connecting members 220 in FIG. 10 comprise a top portion comprising the same length and width as a top portion of the plurality of second parallel conductive members 214.

Alternatively, the single elongated vias 222 may be slightly smaller than first and second parallel conductive members 212 and 214, for example, e.g., by a few nm along the width and length. The second base members 218 may also have inwardly-tapered sidewalls, not shown. The first base members 216 and the first parallel conductive members 212 may also have inwardly-tapered sidewalls, also not shown. The single elongated vias 222 may have sidewalls that are substantially perpendicular to the horizontal surface of the workpiece 202, in some embodiments. The single elongated vias 222 may comprise a length that is substantially the same as the length of the second parallel conductive members 214 in some embodiments, for example.

A via-last dual damascene method may also be used to form the capacitor 260 shown in FIGS. 6 through 10. For example, patterns 268 for the second parallel conductive members 214 and the second base members 218 may first be formed in the third insulating material 224c, and then the patterns 264 for the elongated vias 222 may be formed in the second and third insulating materials 224b and 224c. Then a fill process is used to fill the two patterns simultaneously with a conductive material. Alternatively, two single damascene processes or substractive etch processes may be used to form the second parallel conductive members 214, the second base members 218, and the elongated vias, for example.

Figure 11:
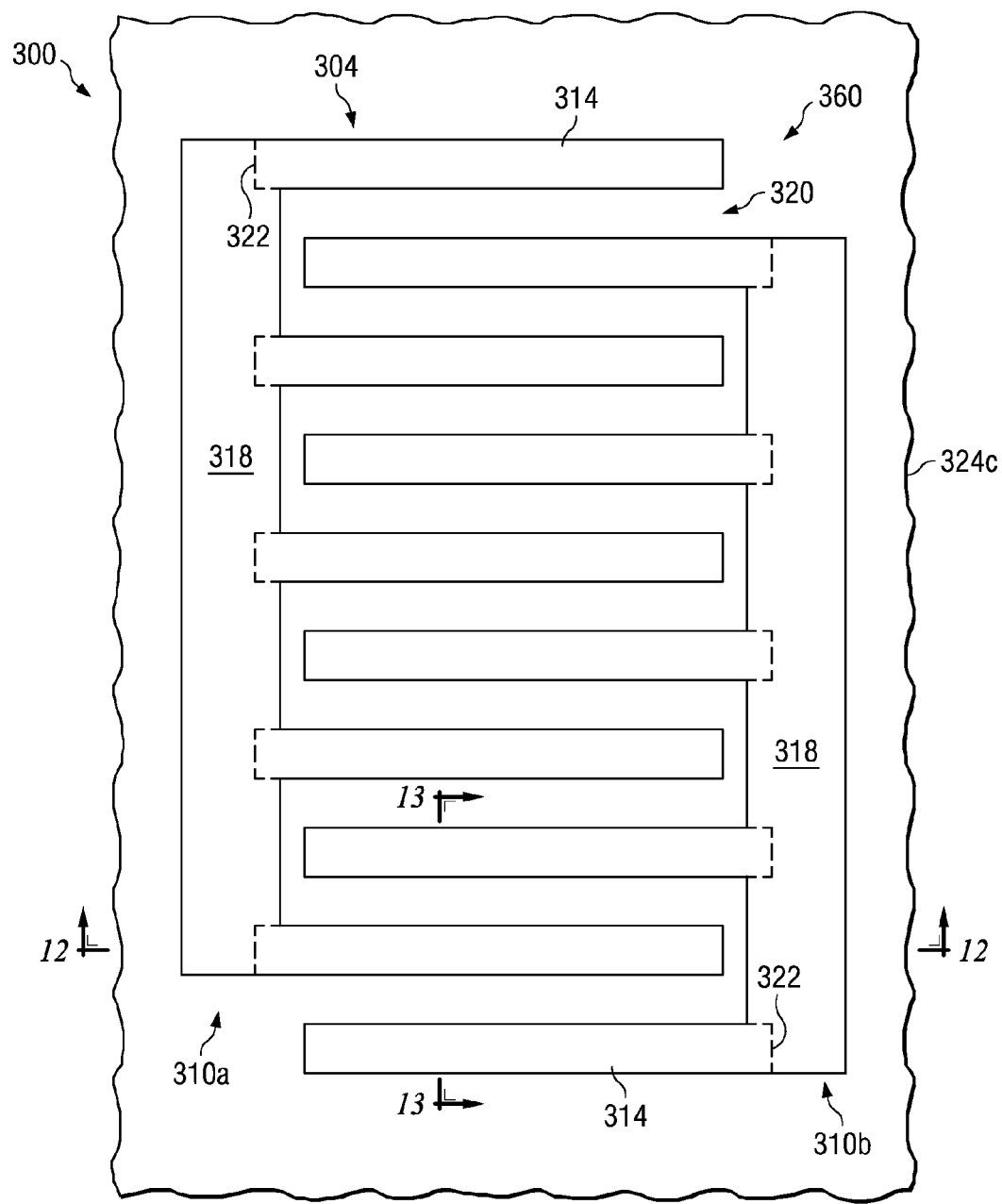
FIG. 11 shows a top view of a capacitor in accordance with another embodiment of the present invention, wherein the connecting members and the second parallel conductive members of the capacitor plates are formed using the same lithography mask.
Figure 12:
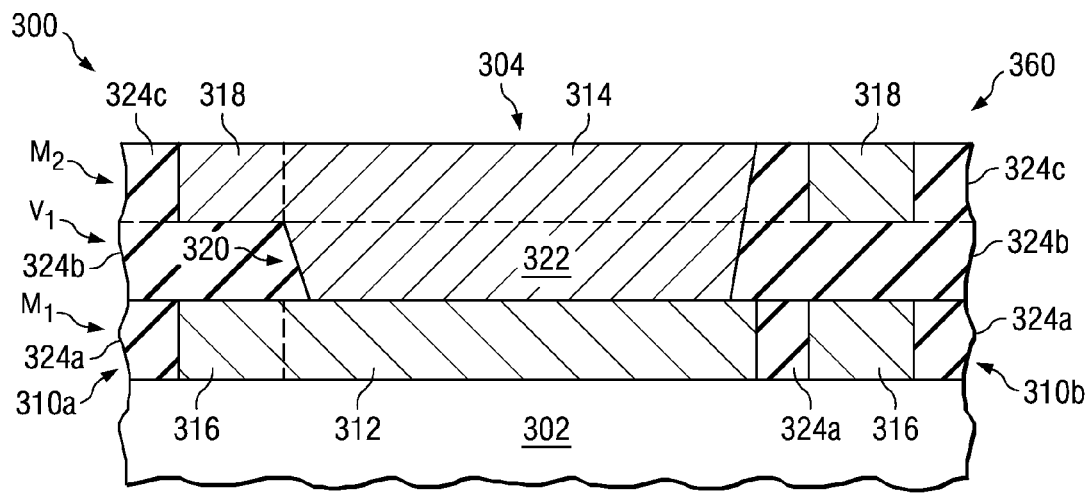
FIG. 12 is a cross-sectional view of the embodiment shown in FIG. 11.
Figure 13:
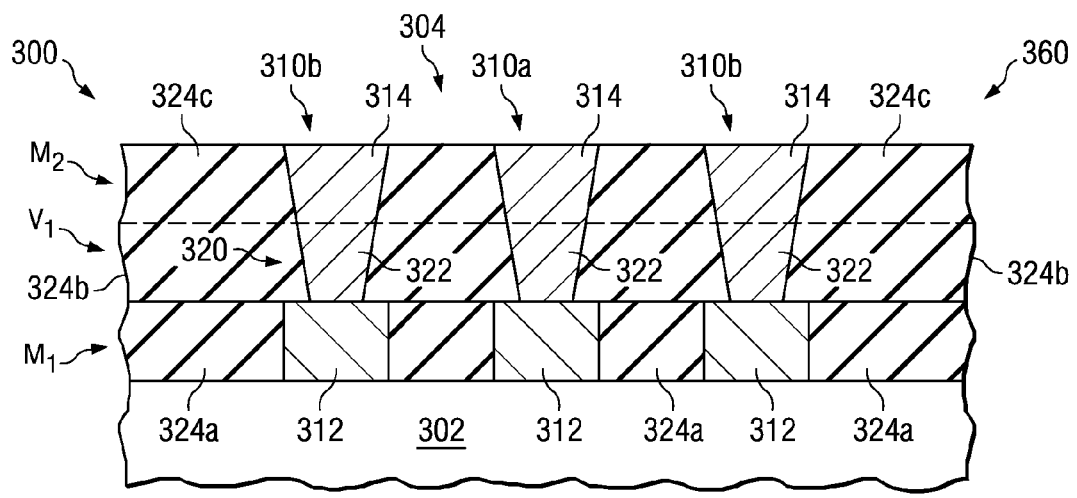
FIG. 13 is a cross-sectional view of the embodiment shown in FIG. 11 in a direction perpendicular to the view shown in FIG. 12.

FIG. 11 shows a top view of a capacitor 360 in accordance with another embodiment of the present invention, wherein the connecting members 320 and second parallel conductive members 314 of the capacitor plates are formed using the same lithography mask. FIG. 12 shows a cross-sectional view of the embodiment shown in FIG. 11, and FIG. 13 shows a cross-sectional view of the embodiment shown in FIG. 11 in a direction perpendicular to the view shown in FIG. 12. The connecting members 320 each comprise a single elongated via 322 comprising substantially the same size and shape as the second parallel conductive members 314. Again, like numerals are used to refer to the various elements that were used to describe the previous figures, and to avoid repetition, each reference number shown in FIGS. 11 through 13 is not described again in detail herein.

To manufacture the semiconductor device 300, a workpiece 302 is provided, and the plurality of first parallel conductive members 312 and first base members 316 of the first and second capacitor plates 310a and 310b are formed within a first insulating material 324a of a conductive material layer $M_1$, using a single damascene process. A dual damascene process is then used to form the elongated vias 322, the second parallel conductive members 314, and the second base members 318 of the first and second capacitor plates 310a and 310b. A via-first process or a via-last dual damascene process may be used.

For example, in a via-first process, a second insulating material 324b is formed over the first conductive material layer $M_1$, and a third insulating material 324c is formed over the second insulating material 324b, as shown in FIG. 12. The second and third insulating materials 324b and 324c may comprise a single insulating material layer, for example, as described for the embodiment shown in FIGS. 6 through 10. A first layer of photoresist (not shown) is deposited over the third insulating material 324c, and the first layer of photoresist is patterned using a first lithography mask (not shown) and an exposure process with a pattern for the elongated vias 322 and the second parallel conductive members 314. The first layer of photoresist is developed, and the first layer of photoresist is used as a mask during an etch process, removing portions of the second and third insulating material 324b and 324c and forming the pattern for the elongated vias 322 and the second parallel conductive members 314 in the second and third insulating material 324b and 324c. The first layer of photoresist is then removed.

A second layer of photoresist (also not shown) is deposited over the patterned second and third insulating material 324b and 324c. The second layer of photoresist fills the patterns in the second and third insulating material 324b and 324c, for example. The second layer of photoresist is patterned using a second lithography mask (not shown) and an exposure process with a pattern for the second base members 318. The second layer of photoresist is developed, and the second layer of photoresist is used as a mask during an etch process, removing portions of the third insulating material 324c and forming the pattern for the second base members 318 in the third insulating material 324c. The second layer of photoresist is then removed. The patterns for the second parallel conductive members and elongated vias 322 intersect with the patterns for the second base members 318.

A conductive material is then deposited over the patterned second and third insulating material 324b and 324c, filling the patterns and forming the elongated vias 322, second parallel conductive members 314, and the second base members 318 in a single fill process. A liner (not shown) may also be used, as shown in FIG. 4. Excess conductive material is removed from the top surface of the third insulating material 324c using an etch process and/or CMP process, so that the top surface of the second parallel conductive members 314 and the second base members 318 is substantially coplanar with the top surface of the third insulating material 324c.

The capacitor 360 shown in FIGS. 11 through 13 may also be formed in a via-last dual damascene process, for example, as described for the embodiment shown in FIGS. 6 through 10.

FIG. 13 shows a cross-sectional view of the capacitor 360 shown in FIG. 11 in a direction perpendicular to the view shown in FIG. 12. The etch processes used to form the single elongated vias 322, the second parallel conductive members 314, and the second base members 318 may result in inwardly-tapered sidewalls, as shown in FIG. 13. The dimension between the top of the second parallel conductive members 314 may be substantially the same as the dimension between the first parallel conductive members 312 of the first and second capacitor plates 310a and 310b. The lower portion of the elongated vias 322 may comprise a smaller width than the top portion of the second parallel conductive members 314, for example, as shown.

The connecting members 320 may comprise at least a top portion comprising substantially the same length and width as a portion of the plurality of second parallel conductive members 314. For example, the connecting members 320 in FIG. 13 comprise a top portion comprising the same length and width as a lower portion of the plurality of second parallel conductive members 314.

The embodiment of the present invention shown in FIGS. 11 through 13 is advantageous because alignment of the elongated vias 322 to the second parallel conductive members 314 is assured, due to the elongated vias 322 and the second parallel conductive members 314 being formed using the same lithography mask. The connecting members 320 comprise elongated vias 322 that have continuous sidewalls with the second parallel conductive members 314 disposed over the elongated vias 322. The second parallel conductive members may comprise a top portion having substantially the same size and shape as at least a top portion of the first parallel conductive members 312 in this embodiment.

Figure 14:
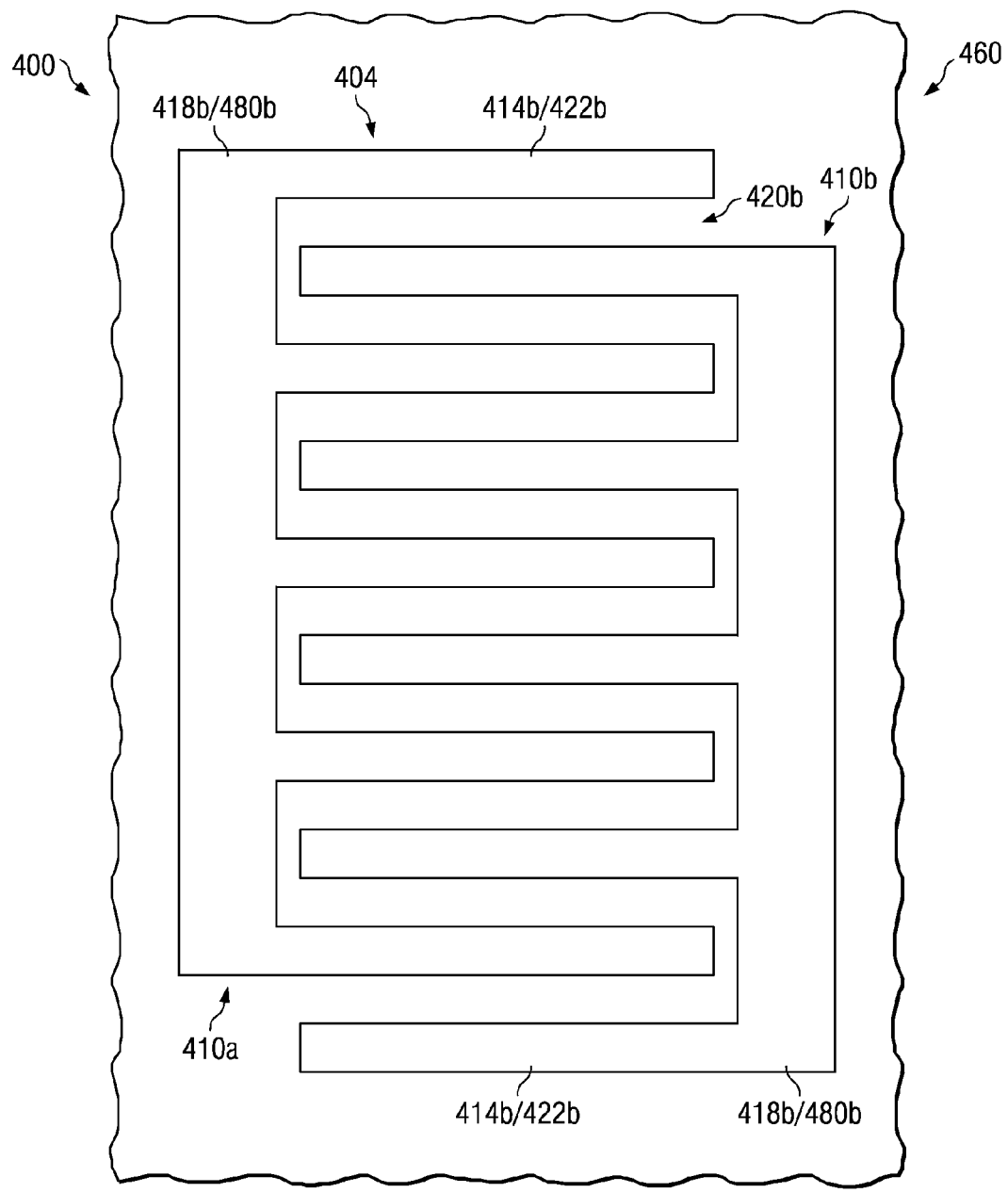
FIG. 14 shows a top view of a capacitor in accordance with yet another embodiment of the present invention, wherein the connecting member further includes a base member.
Figure 15:
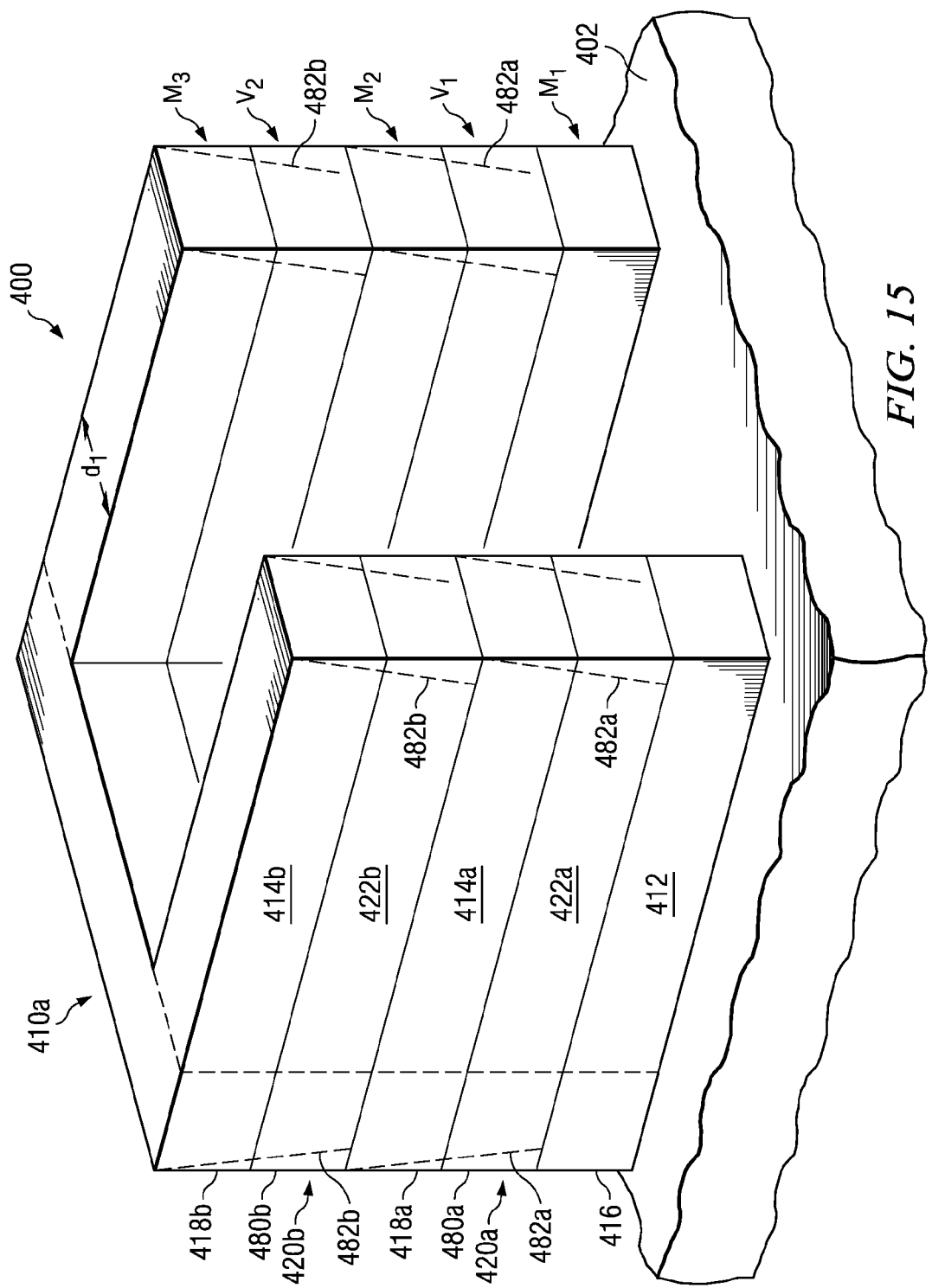
FIG. 15 is a perspective view of the embodiment shown in FIG. 14.

FIG. 14 shows a top view of a capacitor 460 in accordance with yet another embodiment of the present invention, wherein the connecting member 420 further includes a base member 480a coupled to the base members 416 and 418a coupled to the first and second parallel conductive members 412 and 414a. FIG. 15 shows a perspective view of one capacitor plate 410a of the embodiment shown in FIG. 14. Again, like numerals are used to refer to the various elements that were used to describe the previous figures, and to avoid repetition, each reference number shown in FIGS. 14 and 15 is not described again in detail herein.

The connecting members 420a of the novel capacitor plates 410a and 410b comprise elongated vias 422a disposed between the first parallel conductive members 412 and the second parallel conductive members 414a. The elongated vias 422a extend substantially the entire length of the first and second parallel conductive members 412 and 414a in this embodiment, as shown. The connecting members 420a also comprise a third base member 480a disposed between the first base member 416 and the second base member 418a.

In this embodiment, a single mask is used to form the patterns for the connecting members 420a, the second parallel conductive members 414a, and the second base members 418a. Thus, advantageously, a lithography mask, lithography process, and an etch step may be eliminated in accordance with this embodiment of the present invention. However, in some applications, a lithography mask may not be eliminated, because a separate lithography mask may be required to form conductive lines in a conductive line region (e.g., the conductive lines 114' in the second region 106 shown in FIG. 1.) Furthermore, in this embodiment, alignment of the connecting members 420a to the second parallel conductive members 418a and the second base member 414a is assured, because the same lithography mask is used to pattern the connecting members 420a, the second parallel conductive members 414a, and the second base member 418a.

The sidewalls 482a of the second base member 418a, second parallel conductive members 414a, the elongated vias 422a, and the third base members 480a may be continuously inwardly-tapered, as shown in phantom in the perspective view of FIG. 15. Alternatively, the sidewalls of the second base member 418a, second parallel conductive members 414a, the elongated vias 422a, and the third base members 480a may be substantially perpendicular to the top surface of the workpiece 402, for example.

Also shown in FIG. 15 are additional conductive material layers $V_2$ and $M_3$ that include additional connecting members 420b comprising elongated vias 422b and additional base members 480b formed in a fourth conductive material layer $V_2$ disposed over the conductive material layer $M_2$, and additional parallel conductive members 414b and an additional base member 418b formed in a fifth conductive material layer $M_3$ over the elongated vias 422b and third base member 480b. The capacitor plate 410a (and also capacitor plate 410b shown in FIG. 14) may also include more than five conductive material layers $M_1$, $V_1$, $M_2$, $V_2$, $M_3$, with connecting members 420a or 420b including elongated vias 422a or 422b (and also third base members 480a or 480b) and parallel conductive members 412, 414a, or 414b (and also base members 416, 418a, or 418b) in alternating conductive material layers $V_x$ or $M_x$, not shown, which further increases the capacitance of the capacitor 460. Parallel conductive members 414b may comprise third parallel conductive members 414b disposed over the plurality of second parallel conductive members 414a, and connecting members 420b may comprise second connecting members comprising elongated vias 422b that couple the third parallel conductive members 414b to the second parallel conductive members 414a, for example. The sidewalls 482b of the base member 480b, parallel conductive members 414b, elongated vias 422b, and base members 418b may be continuously inwardly-tapered, as shown in phantom, or the sidewalls may be substantially perpendicular to the workpiece 402 top surface. There may be a plurality of third parallel conductive members 414b and second connecting members 420b included in capacitor plates 410a and 410b of a capacitor 460 in accordance with embodiments of the present invention.

The other embodiments described herein may also include additional connecting members 120, 220, 320, 420a, and 420b and parallel conductive members 112, 212, 312, 412, 114, 214, 314, 414a, and 414b formed in additional conductive material layers $V_x$ or $M_x$ disposed over the second parallel conductive members 114, 214, 314, 414b or disposed under the first parallel conductive members 112, 212, 312, and 412, for example, not shown in the drawings. The connecting members 120, 220, 320, 420a, and 420b and parallel conductive members 112, 212, 312, 412, 114, 214, 314, 414a, and 414b may be formed in multiple conductive material layers, or in every conductive material layer of a semiconductor device 100, 200, 300, and 400, for example.

Other embodiments may also include additional connecting members 120" comprising at least one via 122" disposed between the base members 116 and 118 for example, as shown in phantom in the top view of FIG. 5. If optionally any additional conductive material levels are used to form capacitors with more than two conductive levels, the respective additional base members may also be connected by connecting members, for example. Connecting members 120 may comprise first connecting members 120, and connecting members 120" may comprise second connecting members 120", for example. These additional optional connecting members 120" of the respective base members 116 and 118 may comprise single elongated vias (e.g., having a shape similar to vias 222 shown in FIG. 6, not shown in FIG. 5), or the connecting members 120" may comprise an array of multiple vias 122". The shape and size of these optional connecting members 120" of the base members 116 and 118 may be about the same size and shape as the minimum dimension square or circular vias 122' in the second region 106, for example. Alternatively, the connecting members 120" may comprise elongated vias 122" comprising about the same shape as elongated vias 122 shown in FIG. 5, as another example. The additional optional connecting members 120" may alternatively comprise other shapes or sizes, for example. The optional second connecting members 120" disposed between and connecting the base members 116 and 118 may also be included in the other embodiments described herein (not shown), for example.

Referring again to FIG. 1, in some embodiments, the first base member 116 may be coupled to an end of at least some, but not necessarily all, of the plurality of first parallel conductive members 112. Likewise, the second base member 118 may be coupled to an end of at least some, but not necessarily all, of the plurality of second parallel conductive members 114, not shown. For example, one or more of the first parallel conductive members 112 may not be connected to a first base member 116, and one or more of the second parallel conductive members 114 may not be connected to a second base member 118. Connecting members 120 comprising elongated vias may be coupled to the first or second parallel conductive members 112 and 114 to overlying or underlying parallel conductive members to make electrical connection to the first or second parallel conductive members 112 and 114 not connected to a base member 116 or 118, so that they comprise part of the capacitor plate 110 or capacitor 160 (shown in FIG. 5), for example, in these embodiments.

Only one capacitor 160, 260, 360, and 460 is shown in the drawings; however, in accordance with some embodiments of the present invention, a plurality of capacitors 160, 260, 360, and 460 may be formed, e.g., simultaneously, in the metallization layers $M_1$, $V_1$, and $M_2$, and optionally, also within other metallization layers.

After the top-most material layer comprising the second parallel conductive members 114, 214, 314, and 414b and the second base members 118, 218, 318, and 418b of the capacitors 160, 260, 360, and 460 is fabricated, the manufacturing process for the semiconductor devices 100, 200, 300, and 400 is then continued to complete the fabrication process. For example, additional insulating material layers and conductive material layers may be formed over the novel capacitors 160, 260, 360, and 460 and may be used to interconnect the various components of the semiconductor devices 100, 200, 300, and 400.

In the drawings, the ends of the first and second parallel conductive members 112, 212, 312, 412, 114, 214, 314, 414a, and 414b are shown as being substantially square; alternatively, due to the lithography processes used to pattern the first and second parallel conductive members 112, 212, 312, 412, 114, 214, 314, 414a, and 414b, the ends of the first and second parallel conductive members 112, 212, 312, 412, 114, 214, 314, 414a, and 414b may also be rounded or oval in a top view, for example, not shown.

Embodiments of the present invention include semiconductor devices 100, 200, 300, and 400 and capacitors 160, 260, 360, and 460 having capacitor plates 110, 110a, 110b, 210a, 210b, 310a, 310b, 410a, and 410b that include connecting members 120, 220, 320, 420a, and 420b that comprise at least one elongated via 122, 222, 322, 422a, and 422b. Embodiments of the present invention also include methods of fabricating the semiconductor devices 100, 200, 300, and 400, capacitor plates 110, 110a, 110b, 210a, 210b, 310a, 310b, 410a, and 410b, and capacitors 160, 260, 360, and 460 described herein, for example.

Advantages of embodiments of the present invention include providing novel capacitor 160, 260, 360, and 460 designs and methods of manufacture thereof wherein the capacitors 160, 260, 360, and 460 have an improved or increased capacitance density per unit area. Because the novel elongated vias 122, 222, 322, 422a, and 422b are elongated that connect the first and second parallel conductive members 112, 212, 312, 412, 114, 214, 314, 414a, and 414b, more conductive material is present in the capacitor plates 110, 110a, 110b, 210a, 210b, 310a, 310b, 410a, and 410b, increasing the capacitance of the capacitors 160, 260, 360, and 460.

The vertical parallel plate capacitors 160, 260, 360, and 460 described herein are optimized for improved reliability. Alignment problems of vias to portions of capacitor plates 110, 110a, 110b, 210a, 210b, 310a, 310b, 410a, and 410b are reduced or eliminated in accordance with embodiments of the present invention, resulting in reduced leakage current and reduced electric fields. For example, improved alignment of the connecting members 120, 220, 320, 420a, and 420b to the first and second parallel conductive members 112, 212, 312, 412, 114, 214, 314, 414a, and 414b is achieved by embodiments of the present invention. Furthermore, improved and thicker liner 146 formation is achieved of the connecting members 120, 220, 320, 420a, and 420b, also reducing or eliminating leakage current between the capacitor plates 110, 110a, 110b, 210a, 210b, 310a, 310b, 410a, and 410b.

Conductive lines and vias (e.g., in the first region 106 shown in FIGS. 1 and 2) may be formed simultaneously with the formation of the novel capacitors 160, 260, 360, and 460 described herein, for example. Thus, additional etch processes and lithography processes may not be required to manufacture the novel capacitors 160, 260, 360, and 460 in accordance with embodiments of the present invention. For example, the pattern for the first parallel conductive members 112 and first base member 116 may be included in an existing mask level for a metallization layer $M_1$. As another example, minimal sized vias 122' in other regions such as region 106 of FIGS. 1 and 2 may be patterned at the same time and using the same mask 130 (FIG. 3) that is used to pattern the elongated vias 122, 222, 322, 422a, and 422b of embodiments of the present invention.

The novel capacitor plates 110, 110a, 110b, 210a, 210b, 310a, 310b, 410a, and 410b comprise three-dimensional capacitor 160, 260, 360, and 460 structures that are formed in multiple conductive material layers $M_1$, $V_1$, $M_2$, $V_2$, and $M_3$ of a semiconductor device 100, 200, 300, and 400. In some embodiments, the first and second parallel conductive members 112, 212, 312, 412, 114, 214, 314, 414a, and 414b and elongated vias 122, 222, 322, 422a, and 422b of the capacitor plates 110, 110a, 110b, 210a, 210b, 310a, 310b, 410a, and 410b may be ground-rule based, comprising a width of a minimum feature size of a semiconductor device 100, 200, 300, and 400, and achieving a higher capacitance value, for example.

One or more of the capacitor plates 110, 110a, 110b, 210a, 210b, 310a, 310b, 410a, and 410b described herein may be coupled together in series or in parallel. For example, placing the capacitor plates 110, 110a, 110b, 210a, 210b, 310a, 310b, 410a, and 410b in series reduces the overall capacitance of the capacitors 160, 260, 360, and 460 comprised of the capacitor plates 110, 110a, 110b, 210a, 210b, 310a, 310b, 410a, and 410b. Placing the capacitor plates 110, 110a, 110b, 210a, 210b, 310a, 310b, 410a, and 410b in parallel increases the overall capacitance of the capacitors 160, 260, 360, and 460 comprised of the capacitor plates 110, 110a, 110b, 210a, 210b, 310a, 310b, 410a, and 410b.

In some embodiments, the first and second parallel conductive members 112, 212, 312, 412, 114, 214, 314, 414a, and 414b of the capacitors 160, 260, 360, and 460 have substantially the same or similar dimensions as other interconnect features or devices such as conductive lines 112' and 114' formed in other regions 106 of the semiconductor devices 100, 200, 300, or 400, so that the capacitors 160, 260, 360, and 460 are easily integratable into existing semiconductor device structures and manufacturing process flows. The novel capacitors 160, 260, 360, and 460 are low in complexity and cost. The properties of the capacitors 160, 260, 360, and 460 may be tuned by adjusting the capacitor 160, 260, 360, and 460 dielectric material 124a, 124b, 124c, 224a, 224b, 224c, 324a, 324b, or 324c thickness and materials and by adjusting the dimensions of the first and second parallel conductive members 112, 212, 312, 412, 114, 214, 314, 414a, and 414b and the novel elongated vias 122, 222, 322, 422a, and 422b of the connecting members 120, 220, 320, 420a, and 420b, for example.

Although embodiments of the present invention and their advantages have been described in detail, it should be understood that various changes, substitutions and alterations can be made herein without departing from the spirit and scope of the invention as defined by the appended claims. For example, it will be readily understood by those skilled in the art that many of the features, functions, processes, and materials described herein may be varied while remaining within the scope of the present invention. Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A capacitor plate, comprising:
a plurality of first parallel conductive members oriented in a first direction;
a plurality of second parallel conductive members disposed over the plurality of first parallel conductive members;
a first base member coupled to an end of the plurality of first parallel conductive members;
a second base member coupled to an end of the plurality of second parallel conductive members; and
a plurality of elongated vias disposed between the plurality of first parallel conductive members and the plurality of second parallel conductive members, wherein at least two vias of the plurality of elongated vias are disposed between each of the plurality of first parallel conductive members and each of the plurality of second parallel conductive members, and wherein a length of each via of the plurality of elongated vias measured along the first direction is greater than a width of each via of the plurality of elongated vias measured along a second direction perpendicular to the first direction.

2. The capacitor plate of claim 1, further comprising a third base member disposed between the first base member and the second base member.

3. The capacitor plate of claim 1, further comprising:
a second plurality of elongated vias disposed between the first base member and the second base member.

4. The capacitor plate of claim 1, wherein the first base member and the second base member are oriented in a second direction perpendicular to the first direction.

5. The capacitor plate of claim 1, wherein the length of each via of the plurality of elongated vias measured along the first direction is about twice the width of each via of the plurality of elongated vias measured along the second direction.

6. A capacitor plate, comprising:
a plurality of first parallel conductive members oriented in a first direction;
a plurality of second parallel conductive members disposed over the plurality of first parallel conductive members;
a first base member coupled to an end of the plurality of first parallel conductive members;
a second base member coupled to an end of the plurality of second parallel conductive members; and
a plurality of elongated vias disposed between the plurality of first parallel conductive members and the plurality of second parallel conductive members, wherein at least two vias of the plurality of elongated vias are disposed between each of the plurality of first parallel conductive members and each of the plurality of second parallel conductive members, and wherein a length of each via of the plurality of elongated vias measured along the first direction is greater than a width of each via of the plurality of elongated vias measured along a second direction perpendicular to the first direction, wherein each via of the plurality of elongated vias is spaced apart from an adjacent via of the plurality of elongated vias by a distance measured along the first direction, wherein the distance is substantially the same as a width of each via of the plurality of elongated vias.

7. A capacitor comprising:
a plurality of first parallel conductive members oriented in a first direction;
a plurality of second parallel conductive members oriented in the first direction and disposed over the plurality of first parallel conductive members;

a first base member coupled to an end of the plurality of first parallel conductive members and oriented in a second direction;

a second base member coupled to an end of the plurality of second parallel conductive members, the second base member oriented in the second direction; and a first plurality of elongated vias disposed between each of the plurality of first parallel conductive members and each of the plurality of second parallel conductive members, wherein each via of the first plurality of elongated vias is spaced apart from an adjacent via of the first plurality of elongated vias by a first distance measured along the first direction, wherein the first distance is substantially the same as a width of each via of the first plurality of elongated vias, wherein the plurality of first parallel conductive members, the plurality of second parallel conductive members, the first base member, the second base member, and the first plurality of elongated vias form part of a first plate of the capacitor, wherein the length of each via of the first plurality of elongated vias measured along the first direction is greater than the width of each via of the first plurality of elongated vias measured along the second direction.

8. The capacitor of claim 7, wherein the length of each via of the first plurality of elongated vias measured along the first direction is about twice the width of each via of the first plurality of elongated vias measured along the second direction.

9. The capacitor of claim 7, further comprising a third base member disposed between the first base member and the second base member.

10. The capacitor of claim 7, further comprising:
a second plurality of elongated vias oriented along the second direction disposed between the first base member and the second base member.

11. The capacitor of claim 10, wherein the length of each via of the second plurality of elongated vias measured along the second direction is about twice a width of each via of the second plurality of elongated vias measured along the first direction.

12. The capacitor of claim 10, wherein each via of the second plurality of elongated vias is spaced apart from an adjacent via of the second plurality of elongated vias by a second distance measured along the second direction, wherein the second distance is substantially the same as a width of each via of the second plurality of elongated vias measured along the first direction.

13. The capacitor of claim 7, wherein the first direction is perpendicular to the second direction.

14. The capacitor of claim 7, further comprising:
a plurality of third parallel conductive members;
a plurality of fourth parallel conductive members disposed over the plurality of third parallel conductive members;
a third base member coupled to an end of the plurality of third parallel conductive members;
a fourth base member coupled to an end of the plurality of fourth parallel conductive members; and
a second plurality of elongated vias disposed between each of the plurality of third parallel conductive members and each of the plurality of fourth parallel conductive members, wherein each via of the second plurality of elongated vias is spaced apart from an adjacent via of the second plurality of elongated vias by a second distance measured along the first direction, wherein the second distance is substantially the same as the width of each via of the second plurality of elongated vias, wherein the plurality of third parallel conductive members, the plurality of fourth parallel conductive members, the third base member, the fourth base member, and the second plurality of elongated vias form part of a second plate of the capacitor, wherein the first and the second plates form the capacitor.

15. The capacitor of claim 14, wherein each via of the first plurality of elongated vias overlaps with another via of the second plurality of elongated vias along the second direction.

16. A capacitor comprising:
first parallel conductive members oriented in a first direction;
second parallel conductive members oriented in the first direction and disposed over the first parallel conductive members;
a first base member coupled to an end of the first parallel conductive members and oriented in a second direction perpendicular to the first direction;
a second base member coupled to an end of the second parallel conductive members and oriented in the second direction;
a first plurality of elongated vias, wherein at least one via of the first plurality of elongated vias is disposed between each of the first parallel conductive members and each of the second parallel conductive members; and
a first elongated via oriented along the second direction, and disposed between the first base member and the second base member, the first parallel conductive members, the second parallel conductive members, the first base member, the second base member, the first plurality of elongated vias, and the first elongated via forming part of a first plate of the capacitor, wherein the length of the first elongated via measured along the second direction is greater than the width of the first elongated via measured along the first direction.

17. The capacitor of claim 16, wherein the first elongated via comprises a top portion and a bottom portion, wherein the first elongated via is wider at the top portion than in the bottom portion, and wherein the top portion is adjacent the second base member relative to the bottom portion, wherein the at least one via of the first plurality of elongated vias comprises a single elongated via disposed between the first parallel conductive members and the second parallel conductive members.

18. The capacitor of claim 17, wherein the single elongated via comprises a first length, wherein each of the second parallel connecting members comprise a second length, and wherein the second length is substantially the same as the first length.

19. The capacitor of claim 16, further comprising:
third parallel conductive members oriented in the first direction;
fourth parallel conductive members oriented in the first direction and disposed over the third parallel conductive members;
a third base member coupled to an end of the third parallel conductive members and oriented in the second direction;
a fourth base member coupled to an end of the fourth parallel conductive members and oriented in the second direction;
a second plurality of elongated vias, wherein at least one via of the second plurality of elongated vias is disposed between each of the third parallel conductive members and each of the fourth parallel conductive members; and
a second elongated via oriented along the second direction, and disposed between the third base member and the fourth base member, the third parallel conductive members, the fourth parallel conductive members, the third base member, the fourth base member, the second plurality of elongated vias, and the second elongated via forming part of a second plate of the capacitor, the first plate and the second plate forming the capacitor.

20. The capacitor of claim 19, further comprising:
a third elongated via oriented along the second direction and disposed between the first base member and the second base member.

21. The capacitor of claim 16, wherein the length of each via of the first plurality of elongated vias measured along the first direction is about twice the width of each via of the first plurality of elongated vias measured along the second direction.

22. A semiconductor device comprising:
first parallel conductive members oriented in a first direction;
second parallel conductive members oriented in the first direction and disposed over the first parallel conductive members;
a first base member coupled to an end of the first parallel conductive members and oriented in a second direction perpendicular to the first direction;
a second base member coupled to an end of the second parallel conductive members and oriented in the second direction;
a first plurality of elongated vias disposed in a via level over a first region of a substrate, wherein at least two vias of the first plurality of elongated vias is disposed between each of the first parallel conductive members and each of the second parallel conductive members, and wherein a length of each via of the plurality of elongated vias measured along the first direction is greater than a width of each via of the plurality of elongated vias measured along a second direction perpendicular to the first direction, and wherein the first parallel conductive members, the second parallel conductive members, the first base member, the second base member, and the first plurality of elongated vias is part of a plate of a capacitor; and
a plurality of vias disposed in the via level over a second region of the substrate, wherein a length of each via of the plurality of vias measured along the first direction is substantially the same as a width of each via of the plurality of vias measured along the second direction.

23. The device of claim 22, wherein the plate of the capacitor further comprises:
a first elongated via oriented along the second direction, and disposed between the first base member and the second base member, wherein the length of the first elongated via measured along the second direction is greater than the width of the first elongated via measured along the first direction.

24. The device of claim 22, wherein the length of each via of the first plurality of elongated vias measured along the first direction is about twice the width of each via of the first plurality of elongated vias measured along the second direction.

25. The device of claim 22, wherein the plate of the capacitor further comprises a third base member disposed between the first base member and the second base member.

26. The device of claim 22, wherein the plate of the capacitor further comprises a second plurality of elongated vias oriented along the second direction disposed between the first base member and the second base member.

27. The device of claim 22, wherein the first region comprises the capacitor, and wherein the second region comprises a plurality of conductive lines and vias for interconnecting other elements of the semiconductor device.

* * * * *